United States Patent
Xu et al.

(10) Patent No.: US 10,622,909 B2
(45) Date of Patent: Apr. 14, 2020

(54) POWER MODULE FOR INVERTER SWITCHING DEVICES HAVING GATE COILS SHIELDED FROM EDDY CURRENTS

(71) Applicant: FORD GLOBAL TECHNOLOGIES, LLC, Dearborn, MI (US)

(72) Inventors: Zhuxian Xu, Novi, MI (US); Guangyin Lei, Dearborn Heights, MI (US); Chingchi Chen, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 255 days.

(21) Appl. No.: 15/404,388

(22) Filed: Jan. 12, 2017

(65) Prior Publication Data

US 2018/0198378 A1    Jul. 12, 2018

(51) Int. Cl.
*B60L 15/00* (2006.01)
*H02M 7/00* (2006.01)
(Continued)

(52) U.S. Cl.
CPC .............. *H02M 7/003* (2013.01); *B60L 3/003* (2013.01); *B60L 15/007* (2013.01); *H01L 25/07* (2013.01);
(Continued)

(58) Field of Classification Search
CPC ......... H02M 7/003; H02M 7/44; B60L 3/003; B60L 15/007; B60L 2210/40; H05K 7/209
(Continued)

(56) References Cited

U.S. PATENT DOCUMENTS 5,392,702 A * 2/1995 Suzuki .................... B21B 13/14
100/163 R
6,469,607 B1 * 10/2002 Hamadate ............. H01F 27/365
336/84 M
(Continued)

FOREIGN PATENT DOCUMENTS

JP        2002369549 A        12/2002

OTHER PUBLICATIONS

Ichikawa et al, Modules for Hybrid Vehicle Motor Driving, Fuji Electric Review, vol. 55, No. 2 , pp. 46-50, 2009.
(Continued)

*Primary Examiner* — Thienvu V Tran
*Assistant Examiner* — Brian K Baxter
(74) *Attorney, Agent, or Firm* — David B. Kelley; MacMillan, Sobanski & Todd, LLC

(57) ABSTRACT

An inverter for an electric vehicle drive has a bridge configuration using power transistors packaged in actively cooled power modules. Control electrodes in the power modules carrying gate signals to drive the transistors contain inductive coils to increase a common source inductance in order to reduce power losses. Each inverter power module comprises a pair of transistor dies with output electrodes defining a power loop. The control electrodes with inductive coils carrying respective gate signals are arranged to be magnetically coupled with the power loop. For active cooling, a heat conductive plate underlies the dies. A magnetic interrupter is disposed at the heat conductive plate. A localized eddy current preventer is interposed at the heat conductive plate in alignment with the inductive coils to avoid eddy currents that could otherwise reduce the coupling of the inductive coils with the power loop.

20 Claims, 6 Drawing Sheets

(51) Int. Cl.
  *H02M 7/44* (2006.01)
  *B60L 3/00* (2019.01)
  *H01L 25/07* (2006.01)
  *H05K 7/20* (2006.01)
  *H05K 7/14* (2006.01)

(52) U.S. Cl.
  CPC ............ *H02M 7/44* (2013.01); *H05K 7/1432* (2013.01); *H05K 7/20927* (2013.01); *B60L 2210/40* (2013.01); *H01L 2224/40245* (2013.01); *H01L 2224/48091* (2013.01); *H01L 2224/48137* (2013.01); *Y02T 10/645* (2013.01); *Y02T 10/7241* (2013.01)

(58) Field of Classification Search
  USPC ....................................................... 307/10.1
  See application file for complete search history.

(56) References Cited

U.S. PATENT DOCUMENTS

| | | | | |
|---|---|---|---|---|
| 7,719,092 | B2 | 5/2010 | Takubo | |
| 8,823,134 | B2 | 9/2014 | Miyagawa et al. | |
| 9,035,417 | B2 | 5/2015 | Reusch et al. | |
| 2003/0059643 | A1* | 3/2003 | Kim | A01N 59/06 428/626 |
| 2003/0164307 | A1* | 9/2003 | Mogi | C25F 3/06 205/640 |
| 2003/0206087 | A1* | 11/2003 | Raff | H01F 3/12 336/182 |
| 2009/0167477 | A1* | 7/2009 | Feng | H01F 17/0033 336/200 |
| 2010/0025126 | A1* | 2/2010 | Nakatsu | B60L 11/00 180/65.1 |
| 2012/0092120 | A1* | 4/2012 | Yoshikawa | H01F 27/022 336/220 |
| 2013/0181304 | A1* | 7/2013 | Milano | G01R 33/0076 257/421 |
| 2013/0221910 | A1* | 8/2013 | Kim | H02J 5/005 320/108 |
| 2013/0322135 | A1* | 12/2013 | Kusawake | H01F 3/08 363/39 |
| 2014/0320249 | A1* | 10/2014 | Nobusaka | H01F 27/02 336/90 |
| 2015/0069853 | A1* | 3/2015 | Wang | H02M 1/14 307/104 |
| 2015/0123604 | A1* | 5/2015 | Lee | H01F 38/14 320/108 |
| 2015/0318772 | A1* | 11/2015 | Jahshan | H02P 23/00 318/400.41 |
| 2016/0005946 | A1* | 1/2016 | Grishin | H01L 35/32 136/204 |
| 2016/0086726 | A1* | 3/2016 | Ono | H01F 27/365 336/84 M |
| 2016/0155706 | A1 | 6/2016 | Yoneyama et al. | |
| 2016/0322286 | A1* | 11/2016 | Fujino | H01L 23/48 |
| 2017/0358897 | A1* | 12/2017 | Young | H02M 3/155 |
| 2018/0166941 | A1* | 6/2018 | Shen | H02K 5/02 |

OTHER PUBLICATIONS

Yang, Bo and Jason Zhang, "Effect and utilization of common source inductance in synchronous rectification." Twentieth Annual IEEE Applied Power Electronics Conference and Exposition, 2005. APEC 2005, vol. 3. IEEE, 2005.

* cited by examiner

US 10,622,909 B2

POWER MODULE FOR INVERTER SWITCHING DEVICES HAVING GATE COILS SHIELDED FROM EDDY CURRENTS

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to power switching devices in an inverter bridge, and, more specifically, to inverter drive systems for electrified vehicles using discrete power switching circuits having structures to increase common source inductances.

Electric vehicles, such as hybrid electric vehicles (HEVs), plug-in hybrid electric vehicles (PHEVs), and battery electric vehicles (BEVs), use inverter-driven electric machines to provide traction torque. A typical electric drive system as shown in FIG. 14 may include a DC power source (such as a battery pack or a fuel cell) 140 coupled by contactor switches to a variable voltage converter (VVC) 141 to regulate a main bus voltage across a main DC linking capacitor 142. An inverter 143 is connected between the main buses and a traction motor 144 in order to convert the DC bus power to an AC voltage that is coupled to the windings of the motor to propel the vehicle.

The inverter includes transistor switching devices (such as insulated gate bipolar transistors, IGBTs) connected in a bridge configuration with a plurality of phase legs. A typical configuration includes a three-phase motor driven by an inverter with three phase legs. An electronic controller turns the switches on and off in order to invert a DC voltage from the bus to an AC voltage applied to the motor. The inverter may pulse-width modulate the DC link voltage in order to deliver an approximation of a sinusoidal current output to drive the motor at a desired speed and torque. Pulse Width Modulation (PWM) control signals applied to the gates of the IGBTs turn them on and off as necessary so that the resulting current matches a desired current.

Semiconductor switching devices such as an IGBT or a MOSFET are driven at a gate terminal by a gate signal provided by a driver circuit. For an IGBT, the gate signal is applied between the gate terminal and an emitter terminal of the device. In the ON state, an output signal is conducted through the device between a collector terminal and the emitter terminal. Device current flows in a gate loop and in a power loop.

Common source inductance refers to an inductive coupling between the power loop and the gate loop. Current in the output (power loop) portion of the common source inductance modifies the gate voltage in a manner that reinforces (e.g., speeds up) the switching performance. As disclosed in co-pending U.S. application Ser. No. 15/341,184, entitled "Inverter Switching Devices with Common Source Inductance Layout to Avoid Shoot-Through," filed Nov. 2, 2016, and hereby incorporated by reference, the reduced switching time may be desirable since it may have an associated reduction in the energy consumed (i.e., lost) during the switching transition. The magnitude of the gate loop inductance and/or the power loop inductance and the degree of mutual coupling between them can be manipulated (e.g., enhanced) by selecting an appropriate layout and/or including added overlapping coils in PCB traces forming conductive paths to the transistor gates or emitters in order to obtain a desired common source inductance.

The transistor switching devices and associated components (such as a reverse diode across each transistor) are often packaged in a power module. A typical configuration known as a transfer-molded power module (TPM) implements one or more inverter phases by encapsulating transistor dies, diodes, and electrical interconnects (e.g., a lead frame) in an overmolded plastic body. The power module may be attached to a heat spreader plate which is thermally conductive to remove heat generated by the transistors. Active cooling using a "cold plate" can be used instead of or in addition to a heat spreader in order to remove greater quantities of heat more quickly. The cold plate typically includes internal channels to circulate a cooling fluid.

A heat spreader or cold plate may usually include electrically conductive plates or surfaces which extend parallel to the plane of the gate loop and power loop. For example, a cold plate may be comprised of an aluminum shell defining internal passages for conducting a flow of coolant. It has been discovered that Eddy currents generated in these surfaces can produce magnetic fields that can hinder the attempt to enhance the common source inductance.

SUMMARY OF THE INVENTION

In one aspect of the invention, an inverter power module comprises a pair of transistor dies with output electrodes defining a power loop. Control electrodes carry a gate signal and have an inductive coil magnetically coupling with the power loop. A heat conductive plate underlies the dies. A localized eddy current preventer interposed at the heat conductive plate in alignment with the inductive coils.

DETAILED DESCRIPTION OF PREFERRED EMBODIMENTS

Figure 1:
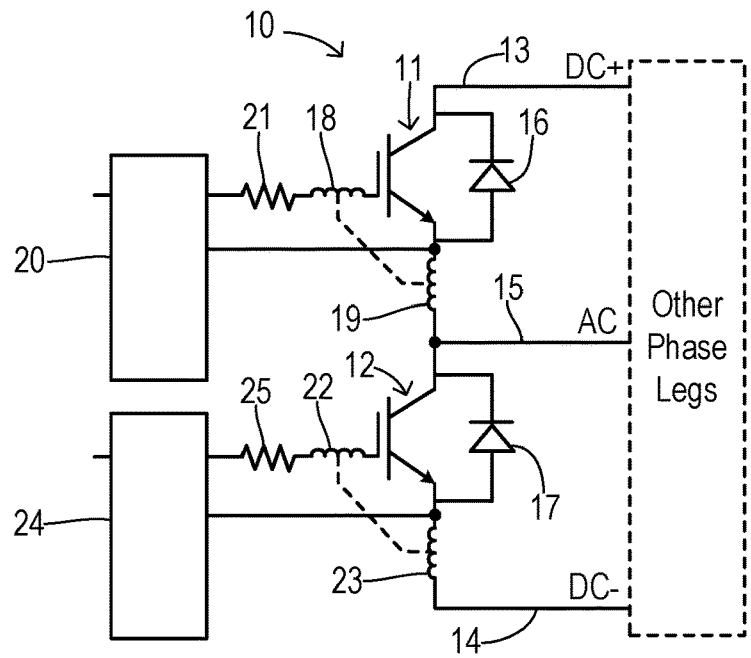
FIG. 1 is a schematic diagram showing an equivalent circuit for a phase leg of an inverter having a pair of IGBTs each of which exhibits a common source inductance.

Common source inductance is an inductance shared by a main power loop and a gate driver loop for a transistor switching device. It usually arises from parasitic inductances associated with the device packaging and traces on printed circuit boards. In the context of switching bridges used for DC to AC power conversion, the presence of common source inductance can be beneficial. FIG. 1 shows an example of a phase leg 10 of the type often used in an inverter drive system in an electrified vehicle for driving an electric motor, wherein an upper transistor 11 is shown as an IGBT with upper gate, collector, and emitter terminals. Other types of semiconductor devices could be used, such as a MOSFET. As used herein, the gate, collector, and emitter terminals of an IGBT also refer to gate, drain, and source terminals of a MOSFET. A lower transistor 12 has lower gate, collector, and emitter terminals is connected in series with upper transistor 11 between a positive bus 13 and a negative bus 14 to define an intermediate junction 15. Buses 13 and 14 provide a DC link that receives a DC supply voltage from a DC power supply (e.g., battery) via a variable voltage converter (not shown). Anti-parallel diodes 16 and 17 are connected across transistors 11 and 12.

The upper gate and emitter terminals create an upper common source inductance comprised of a gate loop inductance 18 magnetically coupled to a power loop (i.e., emitter-side) inductance 19. A gate drive circuit 20 and a gate resistor 21 are coupled to the gate terminal in order to control the switching of upper transistor 11. The lower gate and emitter terminals create a lower common source inductance comprised of a gate loop inductance 22 magnetically coupled to a power loop inductance 23. A gate drive circuit 24 and a gate resistor 25 are coupled to the gate terminal in order to control the switching of lower transistor 12.

Figure 2:
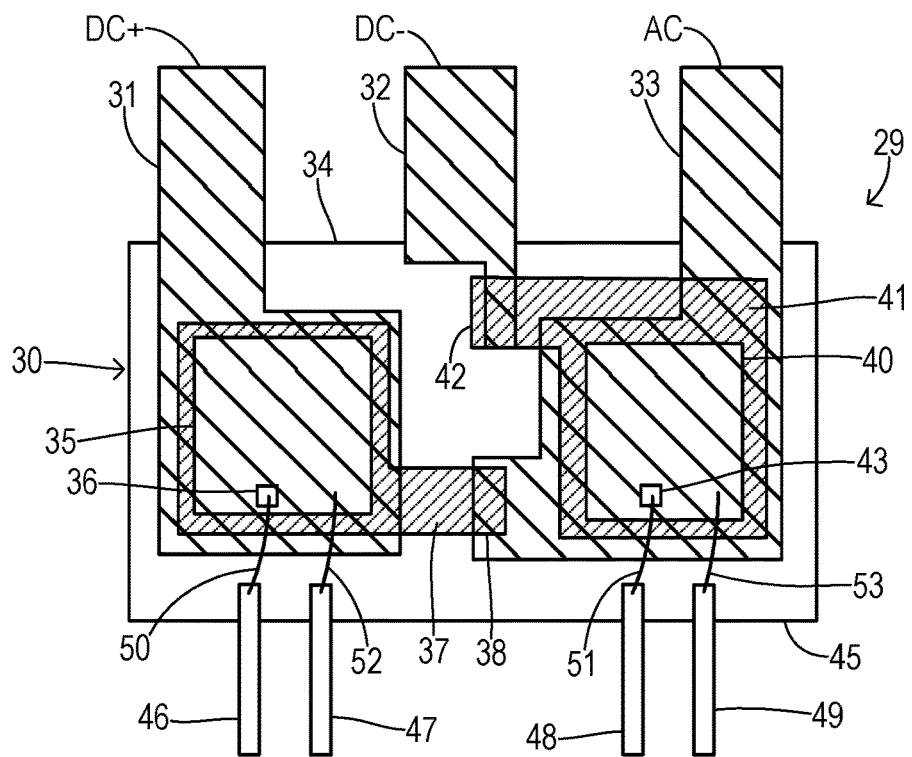
FIG. 2 is a plan view of a transfer-molded power module (TPM) having a pair of IGBTs and a conventional electrode structure.

FIG. 2 shows a transfer-molded power module (TPM) 29 configured to have a minimal common source inductance. The 2-in-1 module carries a pair of switching transistors which are connected for implementing a phase leg of the inverter bridge. Specifically, a molded body 30 carries a plurality of conductive traces or lead frame elements 31, 32, and 33 which extend beyond an edge 34 of body 30 to form power terminals for connecting with the positive bus DC+, the negative bus DC−, and the phase leg output AC, respectively. A first (upper) IGBT 35 is a semiconductor device formed as a die having a collector terminal or pad formed on a bottom surface which is soldered to trace 31. The upper surface of the die provides a gate terminal/pad 36 while the area around pad 36 provides an emitter terminal/pad which is soldered to one end of a bonded lead plate or tab 37. A second end 38 of plate 37 is soldered to trace 33 to connect the emitter of IGBT 35 to the collector of a second (lower) IGBT 40 and to the AC phase leg output. An upper surface of the die of IGBT 40 provides a gate terminal/pad 43 while the area around pad 43 provides an emitter terminal/pad which is soldered to one end of a bonded lead plate or tab 41. A second end 42 of plate 41 is soldered to trace 32 in order to connect the emitter of IGBT 40 to the negative bus DC−. Traces 31-33 and plates 37 and 41 are all electrically insulated from each other and held in place by molded body 30 (which may be comprised of an epoxy resin).

A group of connector pins extend beyond a second edge 45 of body 30, including gate pins 46 and 48 and Kelvin emitter pins 47 and 49. Bonded jumper wires 50 and 51 connect gate pins 46 and 48 to gate terminals 36 and 43, respectively. Bonded jumper wires 52 and 53 connect Kelvin emitter pins 47 and 49 to the emitter pads of IGBTs 35 and 40, respectively. The Kelvin emitter pins are arranged so that they do not carry (i.e., are perpendicular with) the output currents of the IGBTs.

Figure 3:
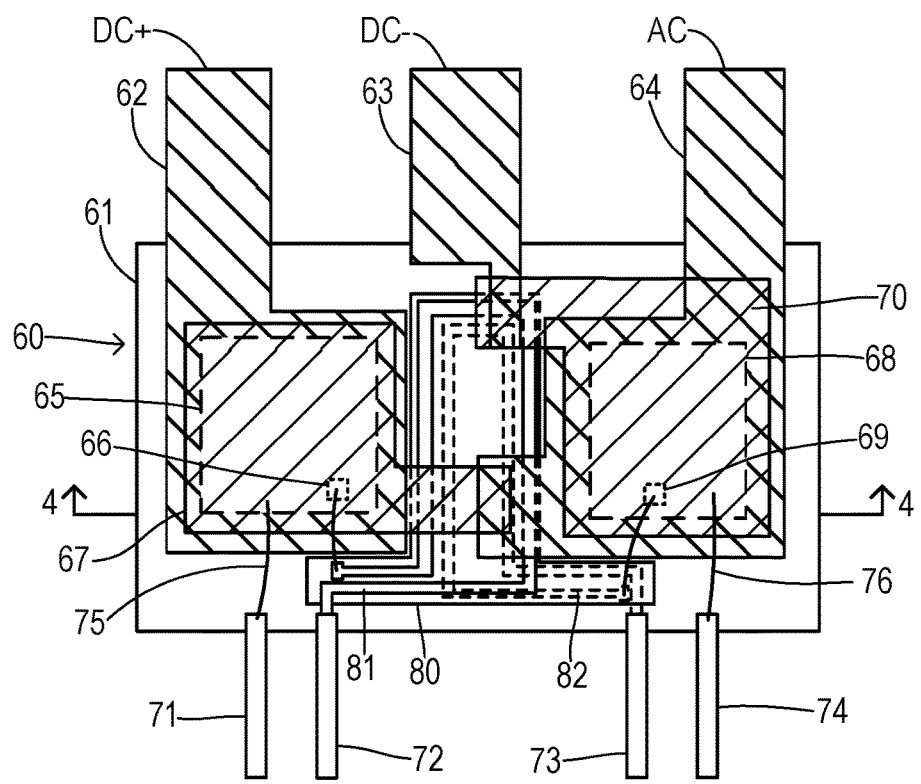
FIG. 3 is a plan view of a transfer-molded power module (TPM) wherein inductive coils in the gate control electrodes are added to enhance a common source inductance.

In the TPM of FIG. 2, a region between conductive tracks 31 and 32 contains a magnetic flux generated by the phase leg output currents which exhibits a locally greatest rate of change. During switching transients of the IGBTs, a large di/dt occurs at the DC+ and DC− terminals while current at the AC terminal changes relatively slowly. Because the region between tracks 31 and 32 corresponds to the highest rate of change in the magnetic flux being generated by the IGBT currents, it has the greatest potential for generating a common source inductance. As shown in FIG. 3, the coupling between a gate loop and a power loop (i.e., the common source inductance) can be enhanced by placing one or more inductive coils in the gate control electrodes (i.e., the gate side or emitter side) which are in close proximity to the high di/dt region. Thus, a 2-in-1 transfer-molded power module (TPM) 60 has an overmolded body 61 which carries a plurality of conductive tracks 62, 63, and 64 of a lead frame to form power terminals for connecting with the positive bus DC+, the negative bus DC−, and the phase leg output AC, respectively. An upper IGBT 65 has a collector terminal or pad formed on a bottom surface which is soldered to track 62. The upper surface of IGBT 65 provides a gate terminal/pad 66 while the area around pad 66 provides an emitter terminal/pad which is soldered to one end of a bonded lead plate or tab 67. Plate 67 is soldered to track 64 to connect the emitter of IGBT 65 to the collector of a lower IGBT 68 and to the AC phase leg output. An upper surface of IGBT 68 provides a gate terminal/pad 69 while the area around pad 69 provides an emitter terminal/pad which is soldered to one end of a bonded lead plate or tab 70. Plate 70 is also soldered to trace 63 in order to connect the emitter of IGBT 68 to the negative bus DC−. Tracks 62-64 and plates 67 and 70 are all electrically insulated from each other by body 61. Copper spacers (not shown) may be used to connect the dies and lead frame.

A Kelvin emitter pin 71 and a gate pin 72 are provided for IGBT 65. A gate pin 73 and a Kelvin emitter pin 74 are provided for IGBT 68. Bonded jumper wires 75 and 76 connect emitter pins 71 and 74 to the emitter pads of IGBTs 65 and 68, respectively. Gates coils are connected between gate pins 72 and 73 and gate pads 66 and 69, respectively, as follows. An auxiliary printed circuit board (PCB) 80 (which may be implemented as a flexible PCB) has a planar T-shaped substrate carrying a first gate coil 81 on an upper surface and a second gate coil 82 on a lower surface formed by conductive traces following a loop pattern. PCB 80 is disposed in the region between the positive and negative tracks 62 and 63 in order to expose coils 81 and 82 to the magnetic flux generated by the currents that flow to or from the DC+ and DC− buses (e.g., at the location where the flux has a locally greatest rate of change). Since the flux is perpendicular to the planar direction of module 60, PCB 80 can be directly between tracks 81 and 82 or can be slightly perpendicularly offset in the direction of the flux and still remain in such region. The voltage magnetically induced in the gate loop by the current in the power loop is proportional to the rate of change of the magnetic flux. By locating the gate coils in the identified region, an enhanced coupling is achieved. By adjusting the size of the coils and/or adding turns to the coils, the common source inductance can be tuned to any needed magnitude. In an alternative embodiment, inductive coils 81 and 82 can be instead be connected between the Kelvin emitter pins and the emitter pads of the IGBTs (i.e., on the emitter side of the gate control electrodes).

Figure 4:
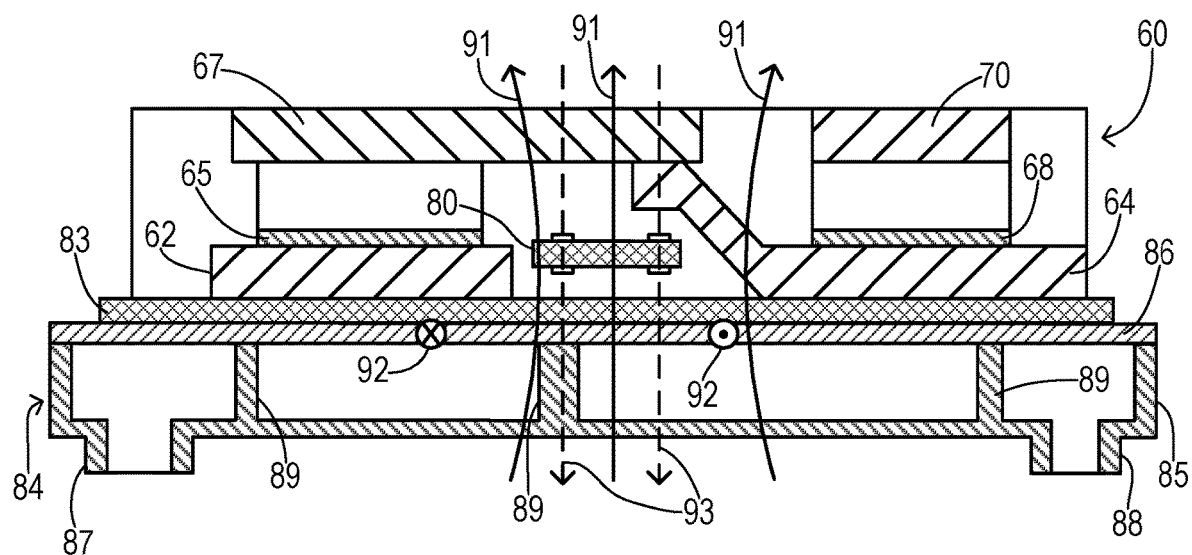
FIG. 4 is a side, cross sectional view of the TPM of FIG. 3 together with a heat exchanger shell or cold plate of an active cooling system, wherein eddy currents reduce an inductive coupling between the gate control electrodes and the power loop.
Figure 5:
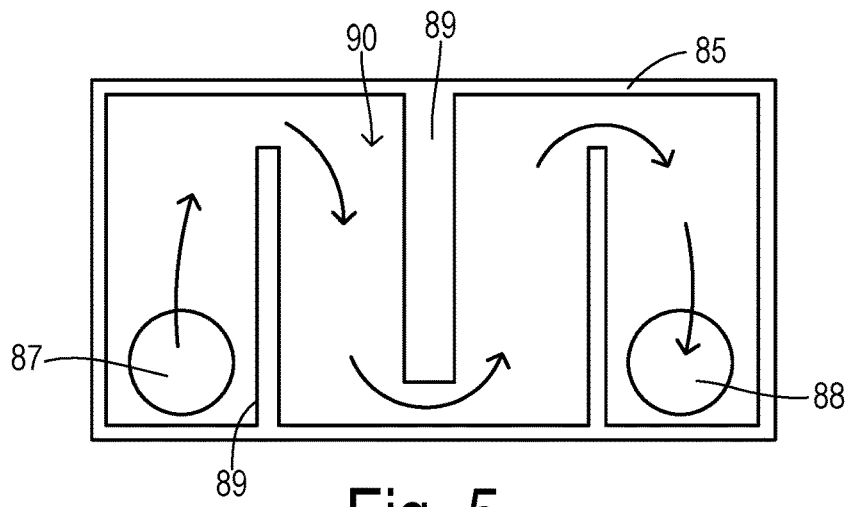
FIG. 5 is a top view of the cold plate of FIG. 4 with a top cover removed.

Due to the heat generation as a result of high current operation of the power converter to drive an electric motor, it is very desirable to employ a heat spreader and/or active cooling (e.g., liquid cooling) for heat removal. In FIG. 4, TPM 60 is attached to a cold plate 84 constructed as a shell with a lower section 85 and a top cover 86 via an insulating sheet 83. Section 85 and cover 86 may be formed as aluminum stampings which are brazed together to form a sealed shell as known in the art. As shown in FIG. 5, section 85 preferably includes inner walls 89 to create a serpentine passage 90 between an inlet 87 and an outlet 88 to convey a cooling fluid. Insulating sheet 83 may be comprised of silicone elastomer or ceramic in order to provide electrical isolation.

FIG. 4 shows magnetic flux lines 91 that are created by a typical current flow in the power loop. Since the magnetic flux is changing, it gives rise to eddy currents in nearby electrically conducting surfaces such as cover 86. An eddy current loop 92 is show by circles indicating flow into and out of FIG. 4. Eddy current loop in turn generates a magnetic flux 93 which opposes flux 91. As a consequence of the reduced overall magnetic flux, the magnetic coupling between the power loop and the gate loop at auxiliary PCB 80 is also reduced, thereby reducing the effectiveness of the enhanced common source inductance.

Figure 6:
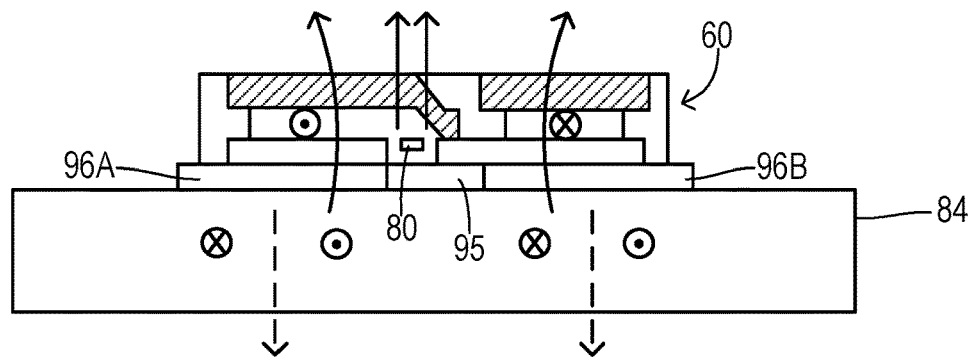
FIG. 6 is a side view of a TPM with a heat conductive plate and a magnetic shield according to one embodiment of the invention.
Figure 7:
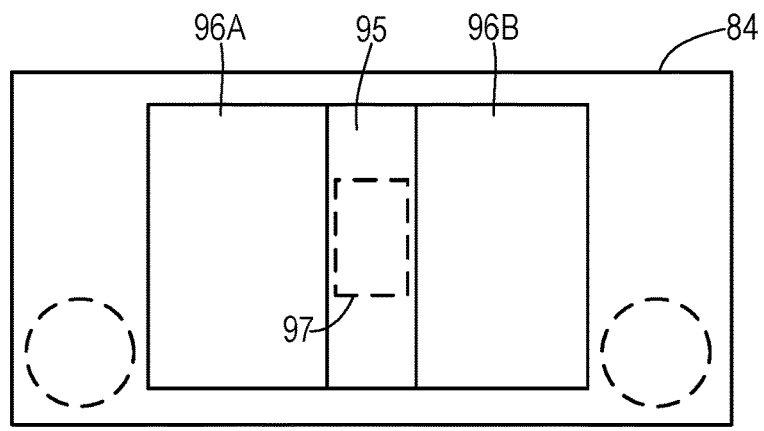
FIG. 7 is a top view of the heat conductive plate and magnetic shield of FIG. 6.

The invention employs one or more countermeasures to prevent eddy currents that would create a magnetic flux coincident with inductive coils in the gate circuit of a power switch intended to enhance the common source inductance. In a first embodiment in FIGS. 6 and 7, a magnetic shielding sheet 95 is inserted between auxiliary PCB 80 (or other structure in the high di/dt region 97 used to form an inductive coil in the gate control electrode) and the conductive surfaces in cold plate 84 (or other heat conductive and electrically conductive plate that may underlie the power switching dies). Shielding sheet 95 has a high permeability and a high resistivity so that 1) magnetic flux is directed away from cold plate 84 beneath the gate coils, and 2) eddy currents are suppressed within sheet 95 itself. FIG. 6 shows that magnetic flux from the power loop passes over PCB 80 without reduction. Sheet 95 may be comprised of silicon steel, for example. It may or may not include a coating to increase the electrical insulation. Due to a relatively higher cost of a typical magnetic shielding material, it may be desirable to utilize a shielding sheet only covering enough area to shield the gate control electrode(s)/inductive coils to get adequate coupling for the common source inductance. Therefore, sheet 95 may be comprised of a narrow strip as shown in FIGS. 6 and 7 with conventional insulating sheets 96A and 96B beneath the remainder of TPM 60. Thus, the eddy current preventer being obtained by the magnetic shielding material need only be in alignment with the gate control electrodes (i.e., inductive coils). Eddy currents are still created in cold plate 84 but they are displaced laterally away from region 97 and the opposing flux generated by the eddy currents does not influence the inductive coils.

Figure 8:
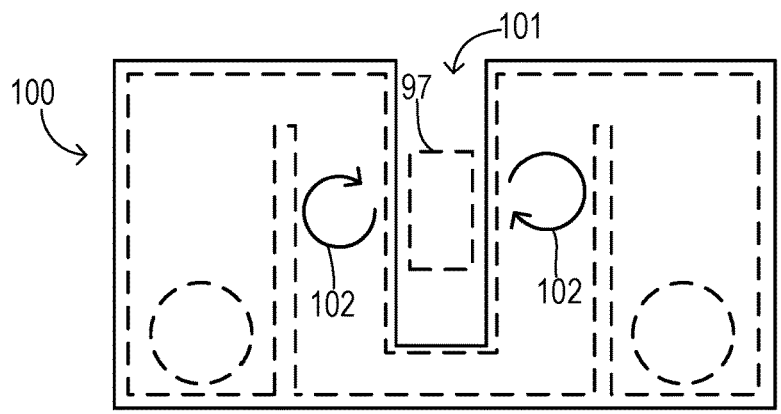
FIG. 8 is a top view of a cold plate or heat exchanger shell according to another embodiment.

In another embodiment shown in FIG. 8, a cold plate 100 is modified to eliminate the conductive surface(s) in the area aligned with the inductive coils/gate control electrodes. Thus, the eddy current preventer has the form of an open slot 101 which creates an electrically non-conductive region coincident with high di/dt region 97. Eddy currents 102 are thus displaced laterally away from region 97 and the opposing flux generated by eddy currents 102 does not influence the inductive coils. Open slot 101 can be created without altering the coolant flow path (i.e., the coolant path extends between both sides of open slot 101) and without significant impact on the area of the heat transfer surface.

Figure 9:
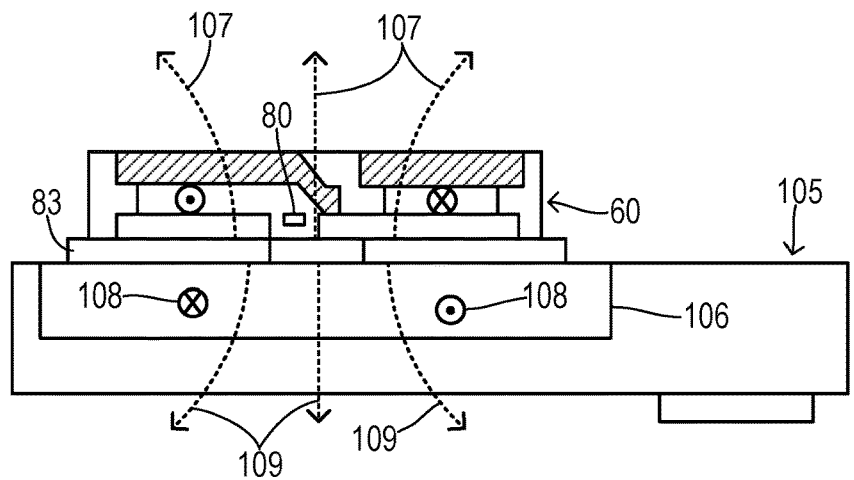
FIG. 9 is a side view of another embodiment wherein a conductive heat spreader plate is combined with an active cold plate having a shell formed of non-electrically conducting material.
Figure 10:
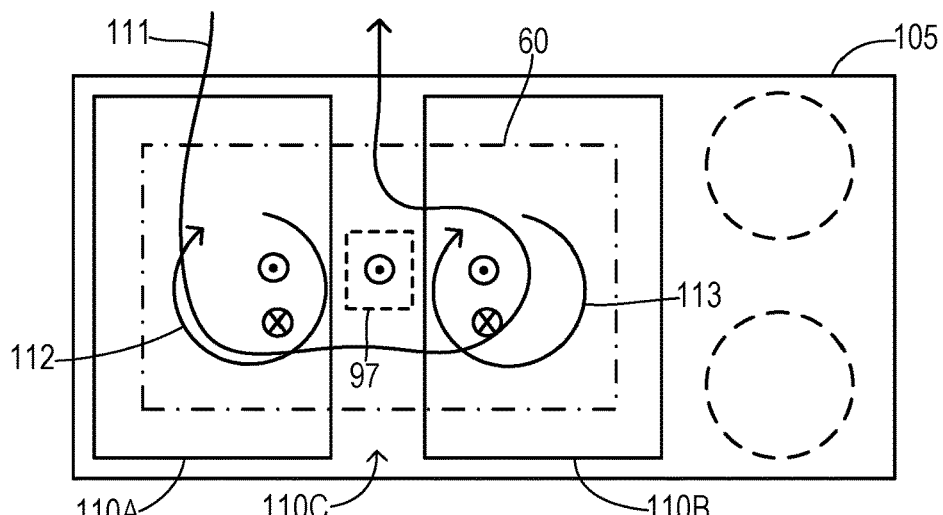
FIG. 10 is a top view of the cold plate and heat spreader of FIG. 9.

FIG. 9 shows an alternate active cooling system wherein a cold plate 105 is formed on a non-electrically conductive material (e.g., molded thermoplastic). To couple heat from TPM 60 into cold plate 105, a metallic heat conductive plate or heat spreader 106 is often used. Thus, a power loop current may induce a magnetic flux 107, giving rise to an eddy current 108 in heat spreader 106. An opposing magnetic flux 109 then reduces the effective flux coincident with inductive gate coils 80. To prevent eddy currents in an area localized around high di/dt region 97, the heat conductive plate is separated into two discontinuous sections 110A and 110B with an intervening region or open slot 110C which is electrically non-conducting. Region 110C provides an open gap in the electrical conductivity, but can be occupied by insulating material such as epoxy molding. Thus, when a current 111 flows in a power loop, eddy currents are created only within sections 110A and 110B which are displaced laterally away from region 97.

Figure 11:
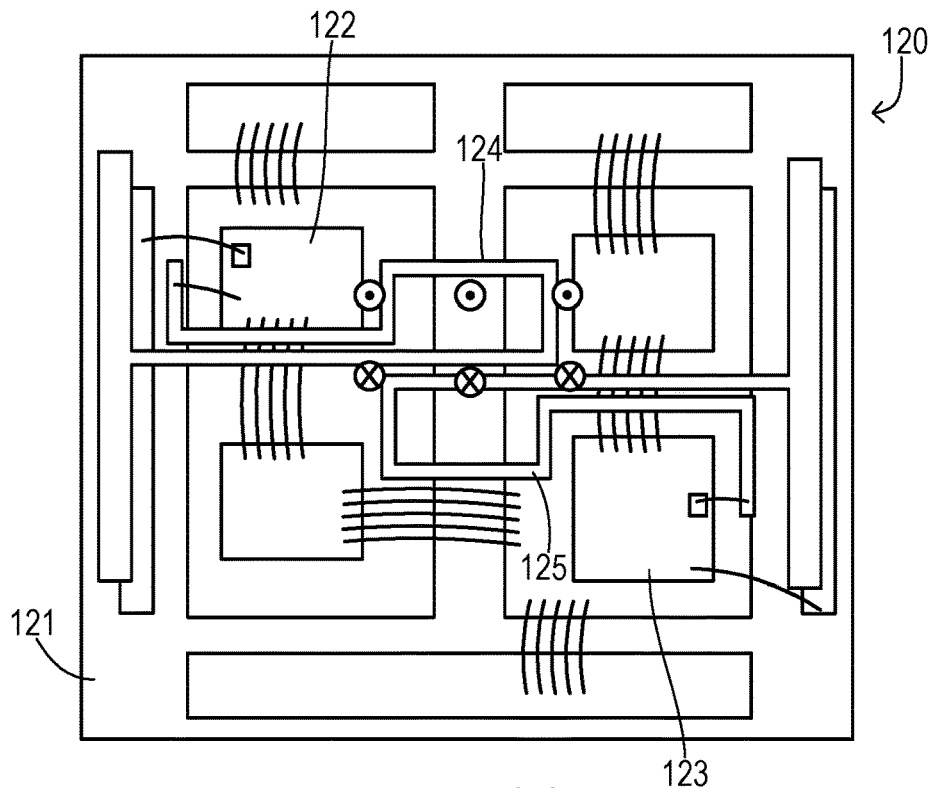
FIG. 11 is a top view of a direct bond copper (DBC) power module having gate control coils.

FIG. 11 shows an alternative power module 120 based on direct bond copper (DBC) technology. A DBC substrate (e.g., ceramic tile) 121 carries power transistor dies 122 and 123 (e.g., IGBTs) on etched portions of a bonded copper layer. Gate control electrodes for dies 122 and 123 include inductive coils 124 and 125, respectively, to enhance a common source inductance. On the reverse side of substrate 121 (not shown), an unetched, continuous copper backing layer is conventionally used (e.g., for heat conduction). However, a continuous layer is subject to eddy currents as described above.

Figure 12:
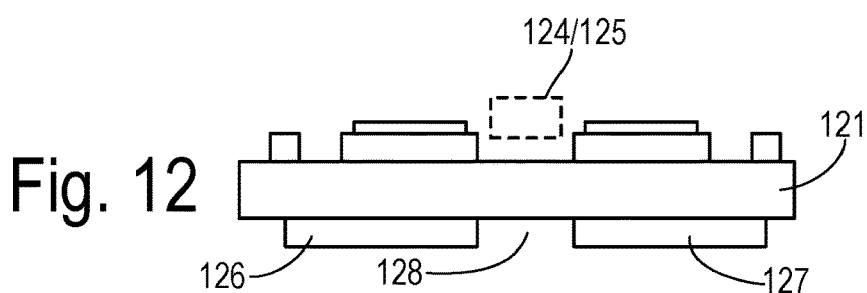
FIG. 12 is a side view of the DBC module of FIG. 11 having a divided backing layer.
Figure 13:
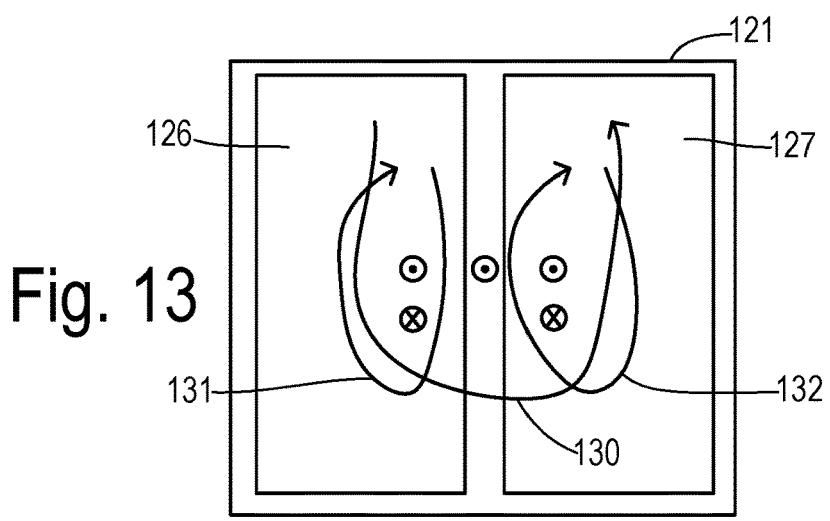
FIG. 13 is a plan view of the divided backing layer of FIG. 12.
Figure 14:
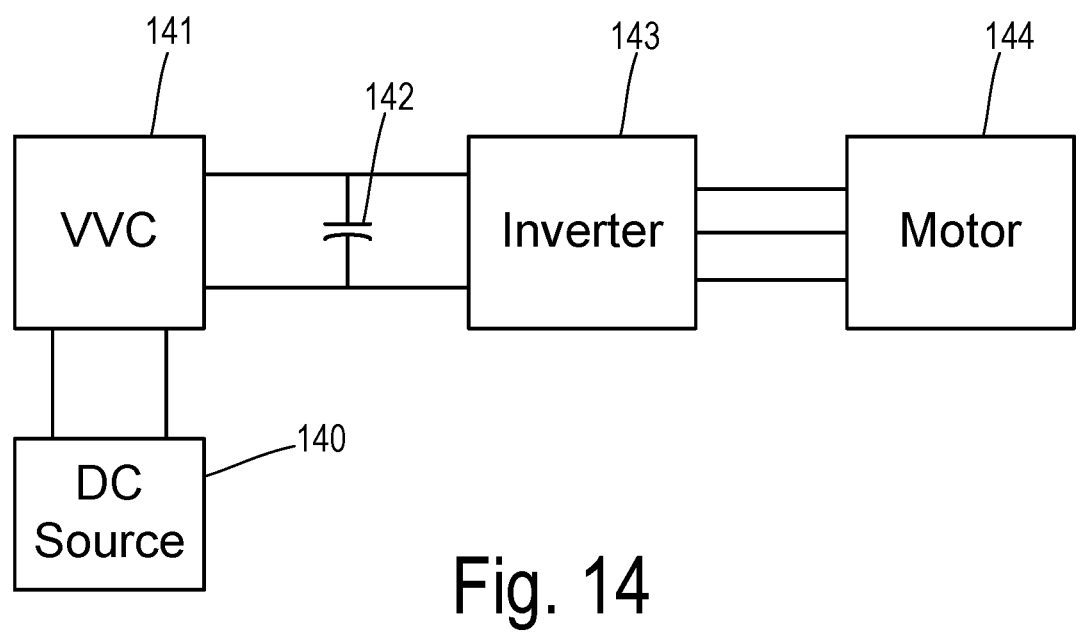
FIG. 14 is a block diagram showing an electric drive system with an inverter wherein the invention can be beneficially used.

FIGS. 12 and 13 show another embodiment of the invention wherein DBC substrate 121 has a backing layer separated into two discontinuous sections 126 and 127 with an intervening electrically non-conducting region 128. In particular, region 128 may be obtained by etching away a corresponding portion of a bonded copper layer. Due to the gap in electrical conductivity, a power loop current 130 only induces displaced eddy currents 131 and 132 so that inductive coils 124/125 are unaffected by an opposing magnetic flux.

What is claimed is:

1. An inverter power module comprising;
   a pair of transistor dies with output electrodes defining a power loop, wherein the pair of transistor dies are coplanar;
   a pair of control electrodes carrying respective gate signals and having inductive coils between the pair of transistor dies magnetically coupling with the power loop;
   a heat conductive plate underlying the pair of transistor dies; and
   a localized eddy current preventer interposed at the heat conductive plate in alignment with the inductive coils, wherein the localized eddy current preventer does not align with the pair of transistor dies or the output electrodes so that eddy currents are not prevented that overlap with the pair of transistor dies or the output electrodes.

2. The inverter power module of claim 1 wherein the localized eddy current preventer is comprised of a magnetic shielding sheet.

3. The inverter power module of claim 2 wherein the magnetic shielding sheet is comprised of silicon steel.

4. The inverter power module of claim 1 wherein the heat conductive plate is comprised of a fluid heat exchanger shell having planar top and bottom walls and an internal channel, wherein the localized eddy current preventer is comprised of an open slot in the walls partially bisecting the fluid heat exchanger shell, and wherein the internal channel provides a coolant flow path extending between both sides of the open slot.

5. The inverter power module of claim 1 wherein the heat conductive plate is comprised of a heat spreader having two discontinuous sections separated by an electrically non-conducting region.

6. The inverter power module of claim 1 wherein the pair of transistor dies and control electrodes are mounted to a direct bonded copper (DBC) substrate, and wherein the heat conductive plate is comprised of a DBC backing layer having two discontinuous sections separated by an electrically non-conducting region.

7. The inverter power module of claim 1 wherein the inductive coils are connected to gate terminals of the pair of transistor dies.

8. The inverter power module of claim 1 wherein the inductive coils are connected to emitter terminals of the pair of transistor dies.

9. The inverter power module of claim 1 wherein the pair of transistor dies each comprise an insulated gate bipolar transistor (IGBT).

10. An electric drive system for a vehicle, comprising:
   a DC link between a pair of buses receiving a DC supply voltage from a power supply;
   a plurality of power modules coupled between the buses in a bridge configuration to provide alternating power to a traction motor, each power module of the plurality of power modules comprising:
      a pair of transistor dies with output electrodes defining a power loop;
      a pair of control electrodes carrying respective gate signals and having inductive coils between the pair of transistor dies magnetically coupling with the power loop;
      a heat conductive plate underlying the pair of transistor dies; and
      a localized eddy current preventer interposed at the heat conductive plate in alignment with the inductive coils, wherein the localized eddy current preventer does not align with the pair of transistor dies or the output electrodes so that eddy currents are not prevented that overlap with the pair of transistor dies or the output electrodes.

11. The electric drive system of claim 10 wherein each localized eddy current preventer of each of the plurality of power modules is comprised of a magnetic shielding sheet.

12. The electric drive system of claim 11 wherein each magnetic shielding sheet is comprised of silicon steel.

13. The electric drive system of claim 10 wherein each localized eddy current preventer of each of the plurality of power modules is comprised of an open slot in the respective heat conductive plate creating an electrically non-conducting region so that eddy currents are displaced laterally away from the inductive coils.

14. The electric drive system of claim 10 wherein each heat conductive plate is comprised of a fluid heat exchanger shell having planar top and bottom walls and an internal channel, wherein each localized eddy current preventer of each of the plurality of power modules is comprised of an open slot in the respective walls partially bisecting the fluid heat exchanger shell, and wherein each internal channel provides a coolant flow path extending between both sides of the respective open slot.

15. The electric drive system of claim 10 wherein each heat conductive plate is comprised of a heat spreader having two discontinuous sections separated by an electrically non-conducting region.

16. The electric drive system of claim 10 wherein the pair of transistor dies and the control electrodes of each of the plurality of power modules are mounted to a respective direct bonded copper (DBC) substrate, and wherein each heat conductive plate is comprised of a respective DBC backing layer having two discontinuous sections separated by an electrically non-conducting region.

17. The electric drive system of claim 10 wherein the inductive coils are connected to gate terminals of the respective pair of transistor dies of each of the plurality of power modules.

18. The electric drive system of claim 10 wherein the inductive coils are connected to emitter terminals of the respective pair of transistor dies of each of the plurality of power modules.

19. The electric drive system of claim 10 wherein the pair of transistor dies of each of the plurality of power modules each comprise an insulated gate bipolar transistor (IGBT).

20. An inverter power module comprising;
   a pair of transistor dies with output electrodes defining a power loop, wherein the pair of transistor dies are coplanar;
   a pair of control electrodes carrying respective gate signals and having inductive coils between the pair of transistor dies magnetically coupling with the power loop;
   a heat conductive plate underlying the pair of transistor dies; and
   a localized eddy current preventer disposed at the heat conductive plate in alignment with the inductive coils, wherein the localized eddy current preventer does not align with the pair of transistor dies or the output electrodes so that eddy currents are not prevented that overlap with the pair of transistor dies or the output electrodes;
   wherein the localized eddy current preventer is comprised of an open slot in the heat conductive plate creating an electrically non-conducting region so that eddy currents are displaced laterally away from the inductive coils.

* * * * *